(12) United States Patent
Uzoh et al.

(10) Patent No.: US 6,861,354 B2
(45) Date of Patent: Mar. 1, 2005

(54) METHOD AND STRUCTURE TO REDUCE DEFECTS IN INTEGRATED CIRCUITS AND SUBSTRATES

(76) Inventors: Cyprian E. Uzoh, 3829 Thompson Creek Ct., San Jose, CA (US) 95135; Homayoun Talieh, 2211 Bentley Ridge Dr., San Jose, CA (US) 95138; Bulent M. Basol, 3001 Maple Ave., Manhattan Beach, CA (US) 90266

( * ) Notice: Subject to any disclaimer, the term of this patent is extended or adjusted under 35 U.S.C. 154(b) by 39 days.

(21) Appl. No.: 10/358,565

(22) Filed: Feb. 4, 2003

(65) Prior Publication Data

US 2003/0160326 A1 Aug. 28, 2003

Related U.S. Application Data

(60) Provisional application No. 60/354,533, filed on Feb. 4, 2002.

(51) Int. Cl.[7] .......................................... H01L 21/4763
(52) U.S. Cl. ........................ 438/643; 438/644; 438/627
(58) Field of Search ................................. 438/627–644, 438/652, 653, 927; 257/750–751, 758

(56) References Cited

U.S. PATENT DOCUMENTS 6,342,447 B1 * 1/2002 Hoshino ...................... 257/751
6,524,950 B1 * 2/2003 Lin ............................. 438/644

OTHER PUBLICATIONS

Victoria Shannon, David C. Smith, Novellus Systems Inc., San Jose "Copper Interconnects for High–Volume Manufacturing" *Semicondutor International*, May 1, 2001.

* cited by examiner

Primary Examiner—Cuong Nguyen
(74) Attorney, Agent, or Firm—Nu Tool Legal Department

(57) ABSTRACT

A method for forming conductor structures on a semiconductor wafer is provided. The method begins with depositing a seed layer having a substantially consistent thickness over a barrier layer that covers the features and the field regions among them. The process continues with electrodepositing a planar copper layer on the seed layer and subsequently electroetching it until a thinned seed layer remains over the field regions. When another layer of planar copper is deposited on the remaining copper in the features and on the thinned seed layer on the field regions, this structure minimizes stress related defects in the features which occur during a following anneal process.

17 Claims, 5 Drawing Sheets

METHOD AND STRUCTURE TO REDUCE DEFECTS IN INTEGRATED CIRCUITS AND SUBSTRATES

RELATED APPLICATIONS

This application claims priority from the provisional application Ser. No. 60/354,533, filed Feb. 4, 2002.

FIELD

The present invention generally relates to semiconductor integrated circuit manufacturing, and more particularly to a method for electroplating copper on a semiconductor wafer to form copper interconnects.

BACKGROUND

The microstructure of electroplated metal films such as electrodeposited copper films is inherently unstable. The physical, mechanical, electrical and other properties of such electroplated films may change over time at room temperature because of the room temperature metal grain recovery and re-crystallization.

To stabilize the electroplated metal films, it is essential to heat-treat the plated film. The electroplated film may be stabilized by allowing the recovery and grain growth process to occur at room temperature over a period of few hours to several months, depending on the nature of the metal layer. Conventionally, however, a copper plated substrate is generally annealed at temperatures above room temperature, typically between 60° C. to 420° C., for periods varying between 30 seconds and 4 hours in an inert environment. Within annealing temperature ranges typically used, the higher the anneal temperature, the shorter time the anneal process takes. Annealing promotes grain growth, stabilizes the film and reduces its electrical resistivity. This improves electromigration resistance and also lowers the electrical resistance of the IC interconnects.

Conductive materials such as copper and its alloys are commonly used in integrated circuit interconnect applications. Copper may be plated by electroless or electroplating techniques on a substrate. One of the essential processing steps in filling damascene and non damascene type features with conductive materials, such as copper, is annealing or heat treatment of the substrate that has such features. As indicated above, annealing stabilizes the microstructure of the conductive film on the substrate, prior to subsequent processing step, especially the CMP step. In many high performance chips or integrated circuits, the damascene process has recently become the method of choice.

As exemplified in FIG. 1, typically, a substrate 10, with or without passive or active devices, for example a silicon wafer with or without front-end devices, may have features, such as trenches 12 and vias 14 or other features of interest, etched into an insulating layer 16 on the substrate. Such features may form the wiring lines and contact vias of an integrated circuit. The insulative surface is then coated with a suitable barrier 18 or adhesive layer such as TaN, TaN/Ta, TiN, TiN(Si), CrN, Cr(O), WN, WN(C), WN(Si), etc. and their various combinations. After the barrier layer deposition, a seed layer 20 is typically coated on the barrier layer 18. For copper interconnect applications, a thin seed layer of copper or copper alloy (typically 2 to 250 nm) is deposited over the barrier layer. After the seed layer deposition step, the features are filled with copper layer 22, preferably from a suitable super filling additive plating bath, with or without leveling agents.

As shown in FIG. 2, in order to make sure that all the features with differing widths and depths are filled, the copper plating process is continued until there is a thick copper layer, or as often called metal overburden, across the substrate. In general, using conventional production methods, the smaller the feature, the larger the overburden layer. This is especially true for vias and trenches having width less than 1 micrometers. Conversely, the wider the features are, the smaller the overburden is (P1,P2 and P3 are overburden thicknesses). This is true for features with intermediate widths, or widths between 2 and 4 microns. Such intermediate width features tend to have a smaller overburden over them. However, for features with line width larger than 5 microns, the overburden tends to be the smallest and independent of the dimensions of the feature for single damascene structures.

As mentioned above, plated films need to be annealed between room temperature and 420° C. for a period of time subsequent to copper plating process. In production environments, there are drawbacks with room temperature recovery and grain growth. As the material undergoes crystal recovery, the metallurgical transformation rates may differ across the wafer. Transformation rates are typically faster in thicker metal deposits compared to the thinner layers. For example, if a 1000 nm copper layer and a 200 nm copper layer are plated on a substrate having 100 nm seed layer, the ratio of the plated film to the seed layer would be 10/1 and 2/1 for thick and thin films respectively. Accordingly, for a given temperature, especially at lower annealing temperatures, re-crystallization would be completed in the thicker film (1000 nm) first and then much later in the thinner film (200 nm). In general, if the ratio of the plated layer to the seed layer (p/s) ratio is smaller, this indicates that longer annealing times or higher annealing temperatures would be required to stabilize the structure and resistivity of the layer.

Thus, as the width of the feature become smaller, the impact of the nature of the seed layer and the seed layer thickness on the re-crystallization rate is more dominant. In this case, a much higher annealing temperature will be needed for full transformation of the metal in the smallest features compared to the largest ones.

While higher temperature may be required to anneal features with fine dimensions, high temperature anneals often result in higher tensile stress on the deposited layer as the substrate cools down from a higher temperature to room temperature. As shown in the exemplary graph 40 in FIG. 3, upon heating the substrate, the tensile stress level in the deposited layer drops (curve 44). However, it starts to rise upon cooling (curve 42) and leaves a large tensile stress in the copper layer. For thicker overburden layers, the resulting tensile stress is higher after re-crystallization steps which involves heating and cooling.

Undesirable effects of overburden, which imposes large tensile stress on the plated structures after grain recovery and re-crystallization, created by the conventional electroplating or electroless deposition processes may be demonstrated with help of FIGS. 4 and 5. FIG. 4 shows a substrate 50, preprocessed and having vias 52 and trenches 54 formed as explained above. After a barrier layer 56 and a seed layer (not shown) are coated on top of the substrate, a copper layer 58 is electroplated until the features 52, 54 are filled and a thick overburden is formed. As shown in FIG. 4, the features may be formed on top of an underlying wire structure 60. As shown in FIG. 5, higher temperature annealing, which is in fact needed for full re-crystallization of the copper in the smaller wiring structures, produces high stresses in the plated layer 58 and results in undesirable defects 62 in the structure. Apart from hillock formation, the imposed tensile stresses cause the vias to separate at their bottom. In other cases, the defect 62 may be in the underlying wire structure 60 and just bneath the barrier layer 56 or at the interface of the barrier layer and the wire structure 60. As the aspect ratio of the vias increases, such defects become widespread. Further, as the metal overburden gets thicker, the damage of such defects increase drastically. Such via separation from the underlying structure as illustrated in FIG. 5 results in very high contact resistance and poor interconnect yield.

From the foregoing, there is a need for methods and structures for high temperature anneal to stabilize metal deposits in very fine wiring structures.

SUMMARY OF THE INVENTION

The present invention describes a method and structure to reduce defects in integrated circuits and substrates. In particular, the present invention describes methods and structure in which a conductive overburden layer is reduced within a determined range, so that thicker conductive material within features and thinner conductive material outside of features can both be annealed at higher temperatures using a relatively short annealing period. Accordingly, defects are reduced, and throughput can be improved.

In one aspect of the process, a method of forming conductor structures on a semiconductor workpiece is provided. The semiconductor workpiece has a surface with cavities that are separated by field regions. The method includes the steps of: depositing a seed layer having a substantially consistent thickness over a barrier layer that is formed on the field regions and in the cavities; depositing a conductive material on the seed layer to form a first planar conductive layer on the seed layer; polishing the planar conductive layer and the seed layer to remove a predetermined thickness of the seed layer over the field regions; and depositing the conductive material in a planar manner on the polished first planar conductive layer and the seed layer to form a second planar conductive layer. The workpiece is annealed after the step after the formation of the second conductive layer.

DETAILED DESCRIPTION

The process of the present invention provides a high throughput anneal process performed at high temperature for a significantly short time. The process of the present invention can be advantageously used to process single wafers sequentially, as well as multiplicity of wafers in batches. In the preferred embodiment, the process of the present invention is initialized with a workpiece that is plated using a planar deposition process.

Figure 1:
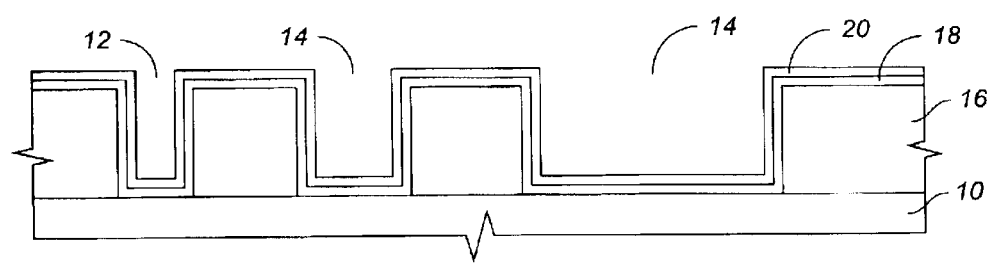
FIG. 1 is a schematic illustration of a substrate having vias and trenches formed in it.
Figure 2:
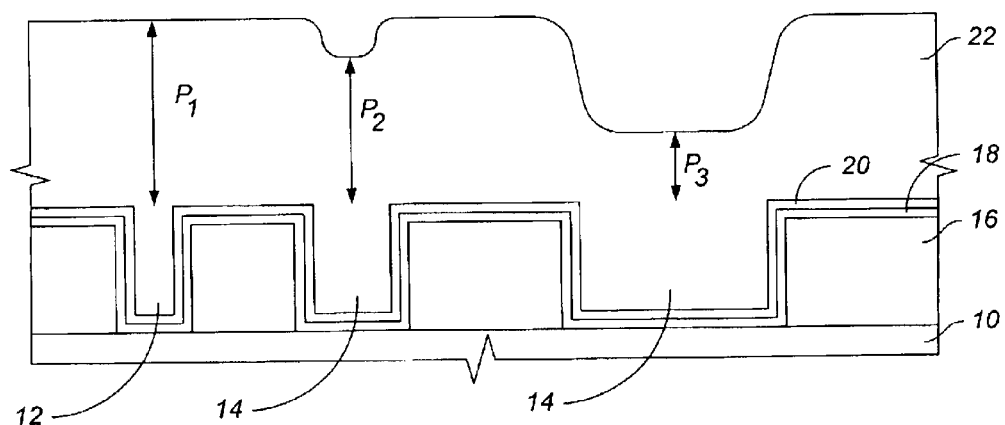
FIG. 2 is a schematic illustration of the substrate shown in FIG. 1 wherein a copper layer has been deposited on top it.
Figure 3:
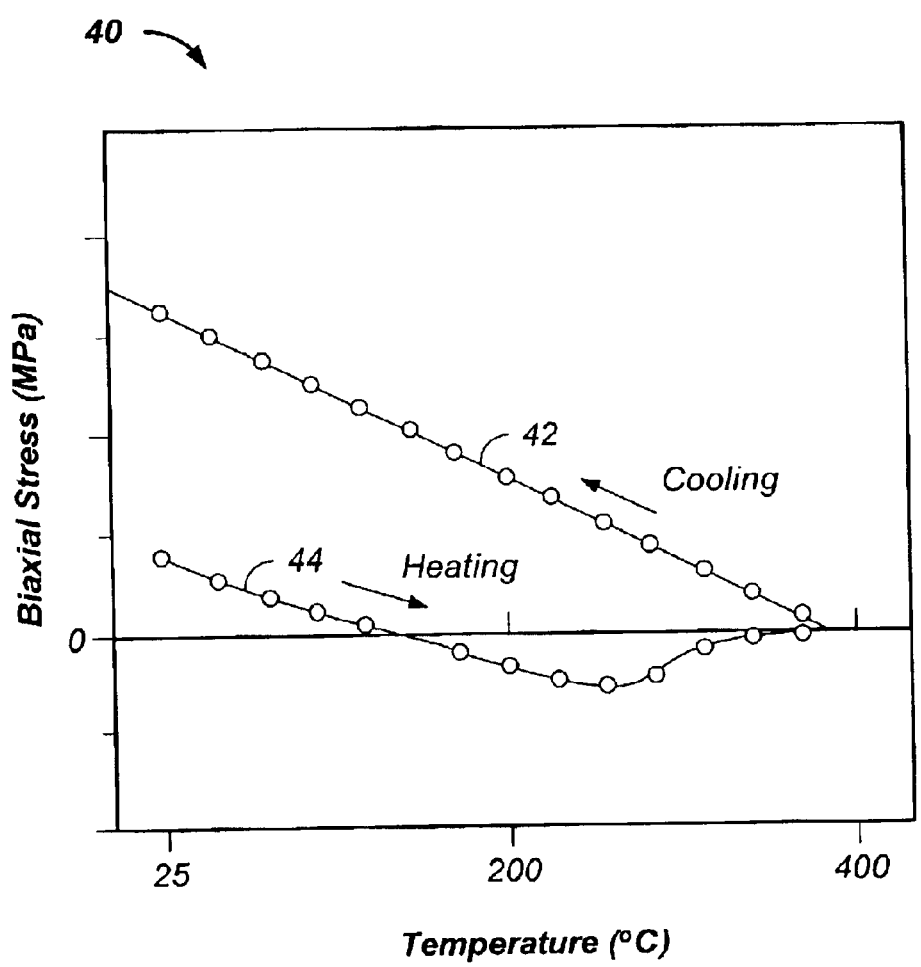
FIG. 3 is a graph showing the relation ship between the tensile stress and the temperature when a substrate having a deposition layer is annealed.
Figure 4:
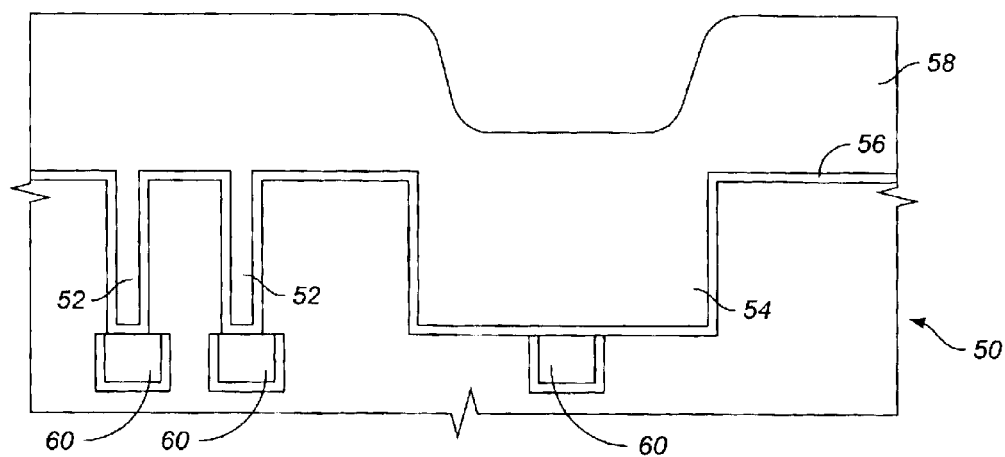
FIG. 4 is a schematic illustration of a substrate having an overburden layer.
Figure 5:
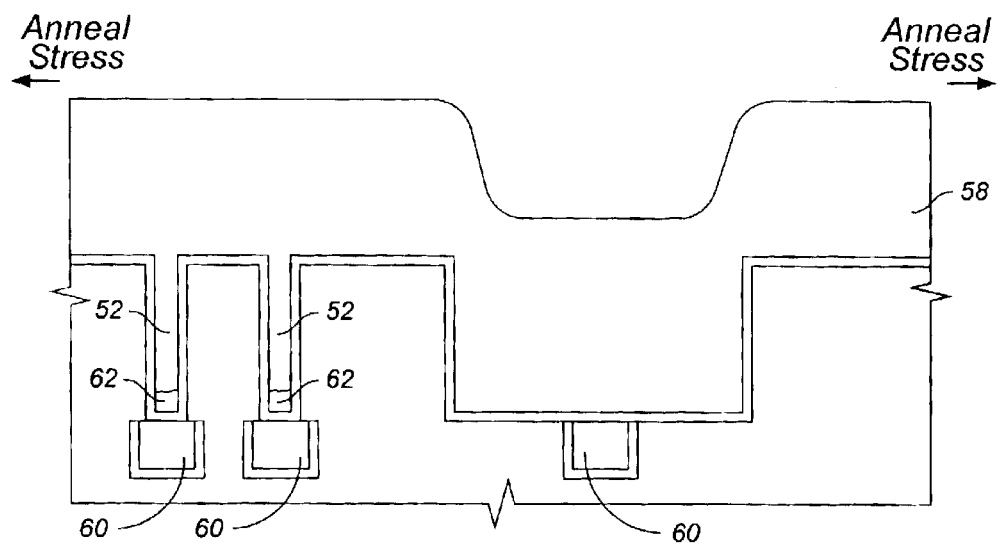
FIG. 5 is a schematic illustration of the substrate shown in FIG. 4 after an annealing process that causes defects.

After conventional metal deposition, i.e. copper deposition from a suitable bath as shown in FIGS. 2 and 4. The resulting plated film to seed layer ratio may vary between 8 to 15 or even higher for first metal layer (M1) and between 10 to 30 or even higher for a dual damascene level.

For example, in FIG. 4, for a metal level with a trench dept of 500 nm, and 50 nm seed layer, a minimum copper deposit of about 700 nm in the field will be required. This implies an overburden of 250 nm over the large structures and overburden usually greater than 750 nm over the smallest structures because of super-fill phenomenon. The plated metal to seedlayer ratio on the substrate will then be at least 14 (700 nm plated metal to 50 nm seed layer). Prior to annealing, the overburden may be reduced to about 500 nm or less (p/s ~8) by CMP methods or by wet etch or electroetching or electropolishing methods. After the first polishing step, the planar metal may be annealed at a higher temperature between 150 to 420° C. to fully stabilize the structure, for periods varying between 5 to 300 seconds in and inert ambient, prior to a second polishing step to remove all the undesirable metal. The annealing is carried out preferably by a rapid thermal annealing (RTA) method.

Figure 6:
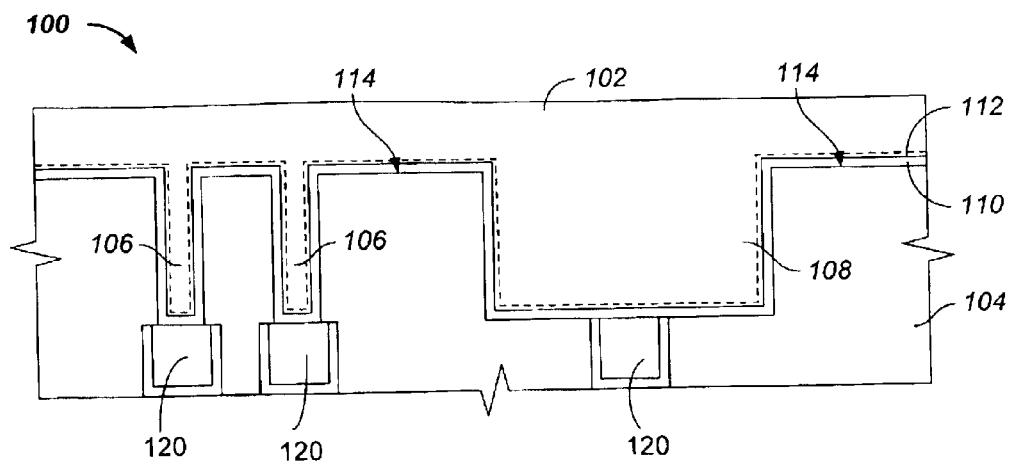
FIG. 6 is a schematic illustration of a substrate having a planar conductive layer on top it.

To minimize the resulting damage from the annealing process, the metal overburden may be reduced such that plated layer to seed layer ratio is below 7, preferably between 0.1 and 5 as shown in FIG. 6. FIG. 6 shows a substrate 100, a preprocessed silicon wafer having a planar conductive layer 102 on it. The conductive layer may be a copper layer that is formed on the wafer 100 using, for example, a planar deposition process or a conventional deposition process followed by a planarization process such as CMP process. Preprocessing of the wafer 100 may include forming an insulation layer 104 on a top surface of the wafer 100 and patterning and etching it to form features to be filled with copper. The features may be vias 106 and trenches 108. The vias and trenches may also partially expose a bottom metal layer 120. In one application, when filled with copper, such features form the wiring infrastructure of an integrated circuit. Conventionally, before the plating process, entire exposed surfaces of the insulating layer 104 or the top surface 105 of the wafer is coated with a barrier layer 110 and a copper seed layer 112 on the barrier layer. The barrier and seed layers coat the exposed portions of the bottom metal layer 120. The barrier layer may be a Ta/TaN composite stack or one of WC, WN(C), TiN layers deposited using PVD or atomic layer deposition process. As a result, the features 106, 108 and top surface 114 of the insulation layer 104, as often referred to as field regions, is coated with the barrier and seed layers 110, 112 respectively.

Figure 7:
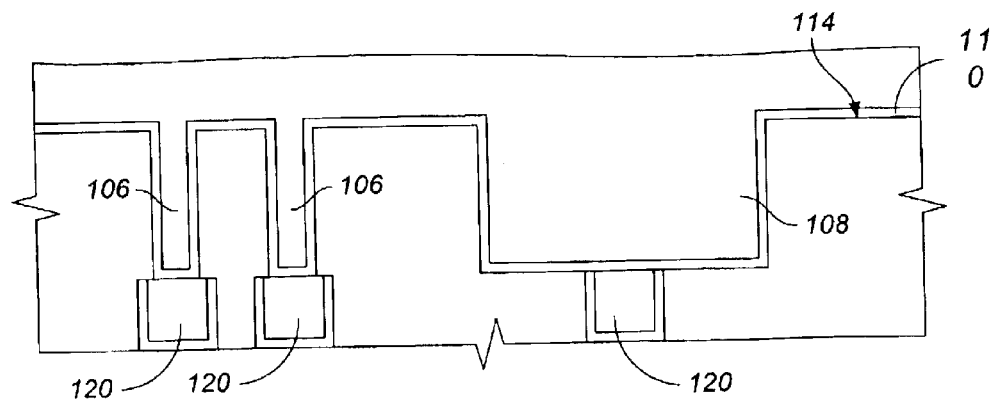
FIG. 7 is a schematic illustration of the substrate shown in FIG. 6, where in the substrate has been processed according to the present invention and annealed.

FIG. 7 shows the substrate 100 after the anneal process. Reducing the overburden prior to annealing step minimizes the resulting stress from the crystallization or re-crystallization process, thus minimizing the problems associated with yield loss due to via separation or detachment from the bottom metal 120.

In one embodiment of the present invention, to reduce the cost associated with multiple CMP operations, for example the pre-anneal CMP and the post anneal CMP method, it is most desirable to anneal a planar film with thin overburden, as disclosed in U.S. Pat. No. 6,328,872, entitled "Method and Apparatus for Plating and Polishing a Semiconductor Substrate", issued Dec. 11, 2001, commonly owned by the assignee of the present invention. Reducing the thickness of the copper layer, which is plated using the conventional methods to reduce the (p/s) ratio, may result in a film where the seed layer plays a dominant role in the texture of the copper film. For example, reducing plated film thickness from 750 nm to about 300 nm by a pre anneal CMP step, will produce a (p/s) ratio of 2 for 100 nm seed layer (200 nm plating+100 nm seed layer). One advantage of the planar film method, as shown in FIGS. 6 and 7, is that, within the thin overburden, of 300 nm, the ratio of (p/s) can be greatly amplified.

Another advantage of reducing the thickness of the overburden, prior to annealing treatment, is that this step may also be used to modify or increase the impurity concentration of the plated structure, when an alloyed seed layer is used. The alloying elements in the seed layer diffuse into the copper during the annealing. For example, if a 100 nm thick Cu(In) alloy layer, with 0.5% indium, is coated over 500 nm deep damascene features. For this structure, reducing the plated metal overburden from 750 nm to 300 prior to annealing treatment, will effectively increase the concentration of indium in the wiring structure.

In the preferred embodiment of the present invention, planar copper layer is plated using Electrochemical Mechanical Processing (ECMPR). It is understood that plating a planar copper layer prior to annealing step minimizes the resulting stress from the crystallization process, thus preventing the problems associated with via separation or detachment from the structures beneath, for example from the bottom layer 120 shown in FIGS. 6 and 7. ECMPR is used to include both Electrochemical Mechanical Deposition (ECMD) processes as well as Electrochemical Mechanical Etching (ECME), also called Electrochemical Mechanical Polishing), although ECMD and ECME processes can be used alone or in combination during an ECMPR process. It should be noted that both ECMD and ECME processes are referred to as electrochemical mechanical processing (ECMPR) since both involve electrochemical processes and mechanical action.

In one aspect of an ECMPR process, a workpiece-surface-influencing-device (WSID) such as a mask, pad or a sweeper is used during at least a portion of the process when there is physical contact or close proximity and relative motion between the workpiece surface and the WSID. Descriptions of various planar deposition and planar etching methods and apparatus can be found in the following patents and pending applications, all commonly owned by the assignee of the present invention. U.S. Pat. No. 6,176,992, entitled "Method and Apparatus for Electrochemical Mechanical Deposition". U.S. application Ser. No. 09/740,701 entitled "Plating Method and Apparatus that Creates a Differential Between Additive Disposed on a Top Surface and a Cavity Surface of a Workpiece Using an External Influence," filed on Dec. 18, 2001, and U.S. application Ser. No. 09/961,193, filed on Sep. 20, 2001, entitled "Plating Method and Apparatus for Controlling Deposition on Predetermined Portions of a Workpiece". These methods can deposit metals in and over cavity or feature sections on a workpiece or substrate in a planar manner. They also have the capability of yielding novel structures with excess amount of metals over the features irrespective of their size, if desired.

In ECMD methods, the surface of the workpiece is wetted by the electrolyte and is rendered cathodic with respect to an electrode, which is also wetted by the electrolyte. This typically results in conductive material deposition within the features of the workpiece, and a thin layer on the top surface of the workpiece. During ECMD, the wafer surface is pushed against or in close proximity to the surface of the WSID or vice versa when relative motion between the surface of the workpiece and the WSID results in sweeping of the workpiece surface. Planar deposition is achieved due to this sweeping action as described in the above-cited patent applications.

In ECME methods, the surface of the workpiece is wetted by the electrolyte or etching solution, but the polarity of the applied voltage is reversed, thus rendering the workpiece surface more anodic compared to the electrode.

Very thin planar deposits can be obtained by first depositing a planar layer using an ECMD technique and then using an ECME technique on the planar film in the same electrolyte by reversing the applied voltage. Alternately the ECME step can be carried out in a separate machine and a different etching or polishing electrolyte. The thickness of the deposit may be reduced in a planar manner. In fact, an ECME technique may be continued until all the metal on the field regions is removed. It should be noted that a WSID may or may not be used during the electroetching or polishing process since substantially planar etching can be achieved either way.

Figure 8A:
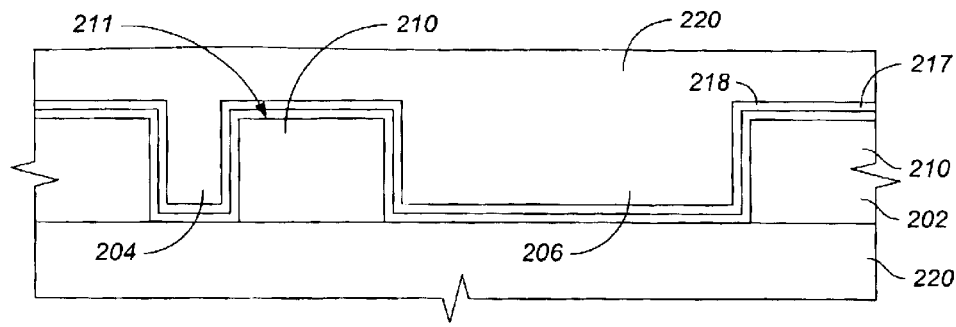
FIG. 8A is a schematic illustration of a substrate having a planar conductive layer on top it.
Figure 8B:
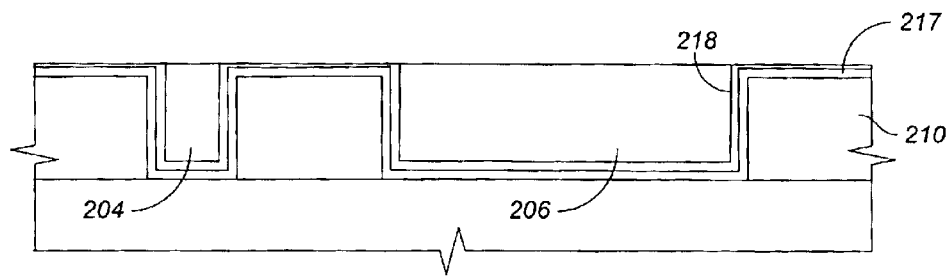
FIG. 8B is a schematic illustration of the substrate shown in FIG. 8A having a thinner seed layer after being polished.

FIG. 8A illustrates a substrate 200 having a planar copper layer (first conductive layer) which is electroplated using an ECMPR technique. The substrate 200 comprises a patterned insulating layer 202 which is comprised of an insulation material such as silicon oxide and is formed using well-known patterning and etching techniques pursuant to metal interconnect design rules. In this embodiment, the insulating layer 202 may be comprised of features such as vias 204 and trenches 206 separated from one another by field regions 210. One or more thin layers of barrier or glue layer 217 coats the features 204, 206 as well as top surfaces 211 of the field regions 210. A thin film 218 of copper is coated as the seed layer on top of the barrier layer for the subsequent electroplated copper layer. A planar copper layer 220 can be formed into the cavities 204, 206 and on the field region 210 using an ECMPR process. In this example the copper layer may for example have a 300 nm thickness and deposited using an ECMD process. After the deposition, using ECME by reversing the polarities, the wafer 200 is rendered anodic. As shown in FIG. 8B, under this anodic condition, the 300 nm overburden or copper layer 220, may be thinned down to the seed layer 218 and also the seed layer 218 on the field regions 210 is partially etched. The wafer may be rendered anodic with a current density that may for example range between 1 to 60 mA/sq.cm, but preferably between 5 and 30 mA/sq.cm for sufficient times not only to remove all the plated film (200 nm Cu) but also reduce the seed layer thickness for example from 100 nm to about 20 nm.

Figure 8C:
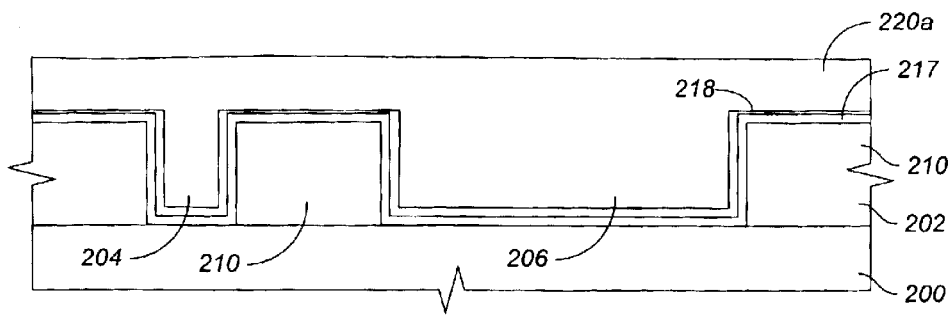
FIG. 8C is a schematic illustration of the substrate having another planar conductive layer formed on top it.

As shown in FIG. 8C, after that, by reversing the plating polarity and rendering the wafer cathodic, a planar layer 220a or overburden (second conductive layer) is plated on the thinned seed layer 218. The planar layer 220a is for example approximately 280 nm thick. With the planar layer 220a, total copper thickness on the field region is still about 300 nm. In this series of processes, the ratio of (p/s) have been increased from a value 2 (200 nm plated metal to 100 nm seed layer) described earlier to 14 (280 nm plated metal to 20 nm seed layer). As a result, the seed layer content of the field may be reduced from 33% or ($\frac{1}{3}$) to about only 7%

(See also FIG. 7). Thus for equivalent metal thickness, the role of the seed layer on film texture have been reduced. In addition, the texture of the plated film have been modified using other ways, for example, a) by reversing the polarity of plating potential for metal removal, b) by touching the surface of the seed layer by a second material during the removal step, c) by touching the surface of the seed layer during the deposition by another material, and d) by various combinations of the above steps.

The above process produces metal deposits with a more random film texture, as compared to the seed layer. After the deposition of a planar and thinner film with modified texture, the substrates is annealed prior to metal planarization steps, either by CMP or by electropolishing method. For copper and its alloys, it is preferable that a phosphoric acid base electrolyte be used even though other suitable electrolytes may also be used. The barrier layer may also be removed either by CMP methods, or RIE methods where there are concerns about the fragility of the insulators, as in some low-k material, the planar copper and barrier layer may be removed by selective electrochemical methods or by employing chlorine plasma assisted with infra red radiation at temperatures between 100 and 200° C. with a suitable end point on the dielectric layer.

It should be noted that the present invention uses conductor layers, such as copper layers, with small overburden, which allows use of high temperature/short annealing time processes without causing defects due to excessive stress built-up. Short anneal times, on the other hand allow use of single wafer processing using RTA approaches which are high-throughput methods that can easily be integrated with rest of the interconnect processes such as electrodeposition, CMP systems etc.

Although the present invention has been described in detail with reference to the disclosed embodiments thereof, those skilled in the art will appreciate that various substitutions and modifications can be made to the examples described herein while remaining within the spirit and scope of the invention. Accordingly, those skilled in the arts may make changes and modifications and employ equivalents without departing from the spirit of the inventions.

We claim:

1. A method of forming conductor structures on a semiconductor workpiece having a surface with cavities that are separated by field regions, the method comprising the steps of:
   (a) depositing a seed layer having a substantially consistent thickness over a barrier layer that is formed on the field regions and in the cavities
   (b) depositing a conductive material on the seed layer to form a first planar conductive layer on the seed layer;
   (c) polishing the planar conductive layer and the seed layer to remove a predetermined thickness of the seed layer over the field regions;
   (d) depositing the conductive material in a planar manner on the polished first planar conductive layer and the seed layer to form a second planar conductive layer.

2. The method of claim 1, further comprising the step of (e) annealing the workpiece after the step (d).

3. The method of claim 2, further comprising the steps of:
   (f) polishing off the second planar conductive layer and the seed layer over the field; and
   (g) polishing off the barrier layer over the filed regions to form a substantially planar conductive structure in the cavities.

4. The method of claim 1, wherein the conductive material is copper.

5. The method of claim 1, wherein the seed layer is copper.

6. The method of claim 2, wherein the seed layer is a copper alloy with at least one alloying element that has a predetermined concentration.

7. The method of claim 1, wherein depositing step (b) is performed using electrochemical mechanical deposition process.

8. The method of claim 1, wherein polishing step (c) is performed using electrochemical mechanical etching process.

9. The method of claim 1 wherein depositing step (d) is performed using electrochemical mechanical deposition process.

10. The method of claim 3, wherein the polishing steps (f) and (g) are performed using chemical mechanical polishing process.

11. An Integrated Circuit manufactured including the steps of claim 2.

12. An Integrated Circuit manufactured including the steps of claim 4.

13. The method of claim 6, wherein the anneal step results in diffusing the alloying element into the copper from the seed layer, which increases effective alloying element in the copper.

14. The method of claim 1, wherein polishing step (c) is performed using electropolishing processes.

15. The method of claim 3, wherein the polishing steps (f) and (g) are performed using electropolishing processes.

16. A method of forming stress relieved conductor structures on a semiconductor workpiece having a surface with cavities that are separated with field regions, wherein a seed layer is formed on a barrier layer that is formed on the field regions and in the cavities, the method comprising the steps of:
   depositing a conductive material on the seed layer so as to form a conductive planar layer on the seed layer;
   polishing down the conductive planar layer and the seed layer in a planar manner until the conductive planar layer is confined in the cavities and a predetermined thickness of the seed layer over the field regions are removed;
   depositing the conductive material in a planar manner on the remaining conductive layer and the seed layer.

17. A method of modifying texture of a conductive layer, comprising the steps of:
   depositing a planar conductive layer over a substrate coated with a barrier and a seed layer on top of the barrier layer;
   removing a substantial amount of the planar conductive layer, including portions of the seed layer thereby leaving a thinner seed layer; and
   plating another layer of conductive material over the thinner seed layer.

* * * * *

UNITED STATES PATENT AND TRADEMARK OFFICE
CERTIFICATE OF CORRECTION

PATENT NO. : 6,861,354 B2
DATED : March 1, 2005
INVENTOR(S) : Uzoh et al.

It is certified that error appears in the above-identified patent and that said Letters Patent is hereby corrected as shown below:

Title page,
Item [73], Assignee, add the following information:
-- ASM NUTOOL, INC., Fremont, California --.

Column 7,
Line 59, after "of" please insert -- : --.

Signed and Sealed this

Fourth Day of October, 2005

JON W. DUDAS
*Director of the United States Patent and Trademark Office*